Jan. 30, 1962 J. H. POMERENE ETAL 3,019,351

VOLTAGE LEVEL TRANSLATING CIRCUIT USING
CONSTANT VOLTAGE PORTION OF DEVICE
CHARACTERISTIC

Filed Dec. 20, 1957

INVENTORS
JAMES H. POMERENE
EDWIN J. SLOBODZINSKI

BY

Alvin J. Riddles
ATTORNEY

United States Patent Office 3,019,351
Patented Jan. 30, 1962

3,019,351

VOLTAGE LEVEL TRANSLATING CIRCUIT USING CONSTANT VOLTAGE PORTION OF DEVICE CHARACTERISTIC

James H. Pomerene, Poughkeepsie, and Edwin J. Slobodzinski, Hopewell Junction, N.Y., assignors to International Business Machines Corporation, New York, N.Y., a corporation of New York Filed Dec. 20, 1957, Ser. No. 704,040
1 Claim. (Cl. 307—88.5)

This invention relates to the coupling of switching circuitry and in particular to voltage level translation between switching circuits.

In high-speed switching circuitry involving semiconductor devices, a shift in signal level has been experienced due to the forward impedance of the semiconductor elements in the circuit which necessitates the introduction of signal shifting equipment in order to facilitate coupling from one such circuit to another. In extremely high frequency operation, the introduction of signal shifting equipment generally is accompanied by detrimental effects on frequency response so that it is expedient that such equipment be eliminated or simplified wherever possible.

This invention is directed to voltage level coupling for transistor switching circuits wherein there is a minimum of associated circuitry and the maximum of reliability. The voltage level coupling arrangement of the present invention includes an asymmetrically conductive device operating in the constant voltage portion of its voltage-current characteristic. Means are also provided to insure that the asymmetrically conductive device will operate as desired and that to a succeeding switching stage a bi-polar voltage level will be provided so as to place the succeeding stage in either its on or off state.

It is a primary object of this invention to provide an improved voltage level translating device.

Another object of this invention is to provide a minimum equipment voltage level translating circuit for coupling semiconductor switching circuits.

A related object of this invention is to provide a method of compensating in a semiconductor switching circuit for the shift in output level that occurs due to the forward impedance of the semiconductor elements of the circuit.

Other objects of the invention will be pointed out in the following description and claims and illustrated in the accompanying drawings, which disclose, by way of example, the principle of the invention and the best mode, which has been contemplated, of applying that principle.

Figure 1:
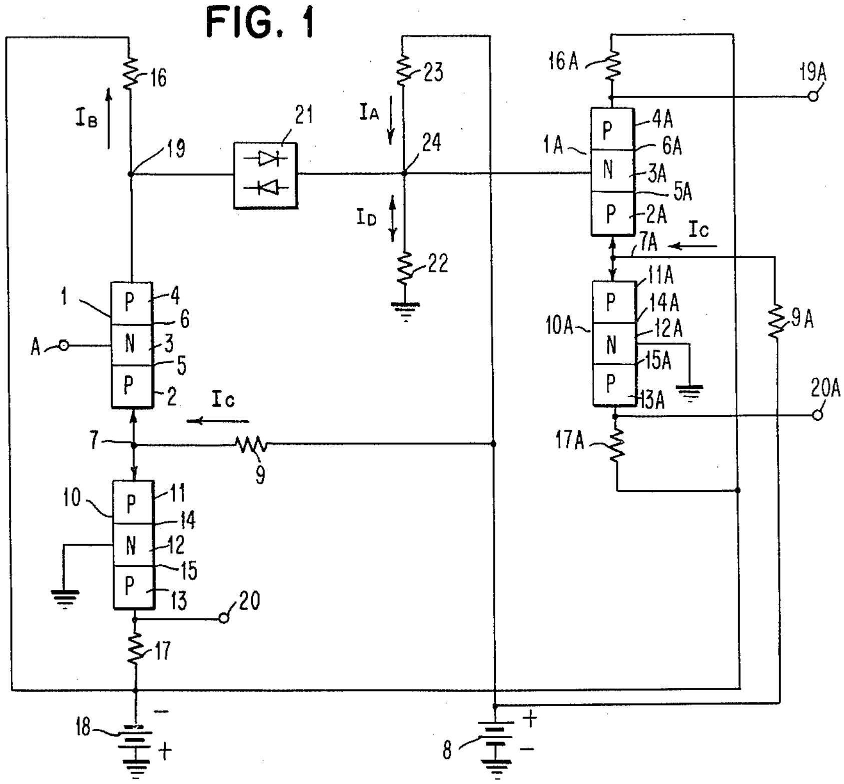
FIG. 1 is an illustration of two current type transistor switching circuits coupled together by the technique of this invention.

Referring to FIG. 1, a two stage current switching logical switching circuit is shown wherein an input signal applied at terminal A of a transistor 1 is inverted and applied directly through a voltage translating circuit of this invention to an input at the base of a transistor 1A of the second stage of the circuit of FIG. 1. An amplified reinverted replica of the input signal applied to terminal A is realized at output 19A of the second stage of the circuit.

In the circuit of FIG. 1, a transistor 1 is provided having an emitter 2, a base 3 and a collector 4 separated by junctions 5 and 6, respectively. The emitter 2 is connected to a common point 7 to which is supplied a constant current illustrated as coming from a source comprising a battery 8 and resistor 9, in series. A second current path is provided comprising a transistor 10 having an emitter 11, a base 12 and a collector 13 separated by junctions 14 and 15, respectively. The emitter 11 is connected to the common point 7 so that transistor 10 provides an alternate current path from the constant current source delivered to point 7 to a reference potential. The collectors 13 and 4 are connected through a symmetrical load system to a reference potential. The symmetrical load system in this illustration is shown as resistor 16 for collector 4 and resistor 17 for collector 13. Both resistors 16 and 17 are returned to reference potential through a power and bias source shown as battery 18. An output terminal 19 is shown connected to the collector 4 of transistor 1 and an output terminal 20, shown unconnected in this illustration, is applied to the collector 13 of transistor 10. The second stage of the switching circuit of FIG. 1 is made up as a duplicate to stage 1, just described, wherein transistors 1A and 10A provide alternate current paths from a common point 7A which is supplied with constant current through resistor 9A from battery 8. Transistor 1A is composed of an emitter 2A, a base 3A and collector 4A separated by junctions 5A and 6A, respectively. The collector 4A is returned through a resistor 16A to the negative terminal of battery 18 and in transistor 10A, an emitter 11A, a base 12A and a collector 13A are provided, separated by junctions 14A and 15A, respectively. The base of transistor 10A is connected to ground and the collector 13A is returned through a resistor 17A to the negative terminal of battery 18. An output terminal labelled 19A is connected to the collector of transistor 1A and another output terminal labelled 20A is shown connected to the collector 13A of transistor 10A. In operation in each stage of the circuit of FIG. 1, current is supplied to the common points 7 and 7A and flows in the symmetrical load system comprising resistors 16, 16A, 17 and 17A in one of two parallel paths depending upon whether transistor 1 or 10 is conducting. Similarly, in the second stage of the circuit, transistor 1A or transistor 10A comprises an active element controlling one of two alternate paths for currents supplied to common point 7A. Assuming, as illustrated, the potential at the base 3 of transistor 1 to be in a no signal condition which is such that conduction to transistor 1 is cut off. The constant current delivered to point 7 from battery 8 through resistor 9 flows through transistor 10 and load resistor 17 to the negative terminal of battery 18. Since the base 12 of transistor 10 is shown connected to ground, the off level for the base 3 of transistor 1, in order to prevent conduction to transistor 1, need merely be as high as the emitter to base potential drop in the crystal of transistor 1 and this is the vicinity of tenths of a volt.

Under these conditions, a maximum positive potential level is established at terminals 20 and 19A and a maximum negative potential value is established at terminals 19 and 20A. When a negative input signal sufficient in magnitude to overcome the reverse bias on junction 5 is impressed on input terminal A, conduction in transistor 1 is initiated, and the direction of current flow supplied to point 7 changes from through transistor 10 to flow through transistor 1. This decreases the potential at point 7 slightly and reverse biases junction 14 of transistor 10 thereby cutting off conduction in transistor 10. The increased current flow through transistor 1 provides a change in potential level across resistor 16 which appears at terminal 19 as a positive shift in potential, while, simultaneously, the decrease in current flow through resistor 17 provides a negative shift at output terminal 20 in the direction of the negative terminal of battery 18. The operation of the stage of the circuit of FIG. 1 involving transistors 1A and 10A is identical to that just described in connection with transistors 1 and 10. Circuitry of the types described in connection with FIG. 1 have been disclosed and claimed in copending application Serial No. 622,307 filed November 15, 1956 and assigned to the assignee of this application.

In circuits of the type shown in FIG. 1, direct current impedance levels may be low at all times on all parts of the circuit and delays due to circuit and transistor capacitance are maintained at a minimum, however, in switching circuitry of this type, a problem is encountered in that between input terminal A and output terminal 19 a potential level shift is encountered which prevents the direct application of an output signal appearing at terminal 19 from being applied directly to the base of an identical building block circuit such as the base 3A of transistor 1A, as illustrated in FIG. 1.

It has been discovered that a semiconductor diode may be provided with a substantially constant voltage characteristic such that it is ideal in the constant voltage operation condition to provide a voltage level shift of potential such that the output of one type of transistor may be directly coupled to the input of the same type of transistor and the constant voltage portion of the characteristic of the diode will, with an absolute minimum of circuitry, compensate for the internal potential level shift taking place within a transistor of a logical block such as the first stage of FIG. 1. The voltage level translating device of this invention comprises an asymmetric impedance having a substantially constant voltage region in its characteristic and current supply means associated with the terminals thereof to cause the asymmetric impedance to operate in its constant voltage region.

Figure 2:
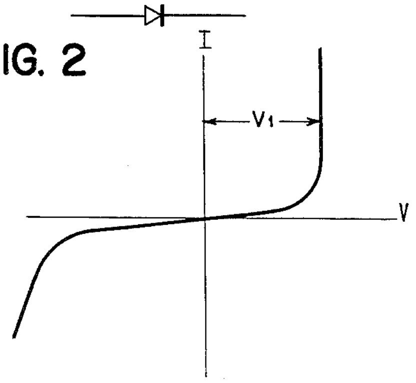
FIG. 2 is the impedance characteristic of a conventional crystal diode.

Referring now to FIG. 2, the output characteristic of a a conventional semiconductor diode is shown in the forward direction wherein a constant voltage $V_1$ is illustrated in the forward direction representing a potential drop of current flowing through the forward impedance of the diode. Similarly, in FIG. 3, a semiconductor diode is shown in the reverse direction wherein a region of constant voltage labelled $V_2$ is shown for the region of operation wherein the avalanche or Zener breakdown of the diode is taking place. As will be apparent from later discussion, diodes suitable for the voltage translating application of applicants' invention may be of the conventional crystalline diode type, the Zener diode type or of the polycrystalline diode type so long as the diode is provided with an output characteristic having a substantially constant voltage portion.

Returning now to FIG. 1, it will be apparent that in order to couple an output signal at terminal 19 directly to the input at the base 3A of transistor 1A, it will be necessary to provide the diode with sufficient bias to operate on the constant voltage portion of its characteristic. For purposes of illustration, the diode has been shown in FIG. 1 as a box labelled element 21 and biasing is achieved by a voltage divider network comprising a resistor 22 and a resistor 23 connected between reference potential and the positive terminal of battery 8. One of the terminals of the diode is connected to a point 24 between resistors 22 and 23 and the other terminal of the diode is connected to output terminal 19.

The following specifications are provided as an illustrative embodiment of the circuit of FIG. 1, merely for the purpose of aiding and understanding and practicing the invention and to provide a basis for comparison. The following specifications should not be construed as a limitation on such circuitry as it is well established in the art that a wide range of such specifications are available.

Transistors 1, 1A, 10 and 10A—PNP type $\alpha$ cutoff—5 megacycles $\alpha > .95$ With a maximum of 0.4 volts, emitter to base voltage drop with 4 milliamperes collector current and a minimum emitter to base breakdown voltage of 1.5 volts.

| | | |
|---|---|---|
| Batteries 8 and 18 | volts | 45 |
| Resistors 16, 16A, 17 and 17A | ohms | 6200 |
| Resistors 9 and 9A | do | 10,000 |
| Resistor 22 | do | 300 |
| Resistor 23 | do | 10,000 |

Device 21—Germanium diode—back resistance 5 megohms—forward resistance potential drop 0.6 volts at 1 to 6 milliamperes current.

Under the above recited conditions, a constant current of approximately 4 milliamperes illustrated in FIG. 1, as an arrow labelled $I_C$ is supplied to points 7 and 7A of the circuit. At point 24, from the positive terminal of battery 8 through resistor 23, a current of 4 milliamperes is delivered and labelled $I_A$. Under these conditions, a 6 milliampere current flows through resistor 16 and is illustrated in FIG. 1 as $I_B$. 2 milliamperes of this current is made up of $I_D$, to be later explained.

Assuming an input signal applied to terminal A varying from +0.6 volt to −0.6 volt, in the +0.6 volt condition transistor 1 is cut off and transistor 10 is conducting. The collector 4 of transistor 1 tends in the direction of the negative terminal of battery 18 and is limited from the value only by the back current ($I_{C0}$) through the collector junction 6 flowing through resistor 16. Under these conditions, if the asymmetric impedance connected as element 21 is the Zener diode, shown in FIG. 3, the diode breaks down to $V_2$ since the 45 volts of battery 18 appears across it and the 6 milliamperes making up $I_B$ flows through the diode, 4 milliamperes of the 6 being composed of $I_A$ and the remaining 2 milliamperes being composed of a current labelled $I_D$ flowing from ground through resistor 22 to point 24. Under these conditions, the choice of resistors 22 and 23 are such that the potential level at point 24 is −0.6 volt.

When the input level at terminal A shifts to the −0.6 volt value, the 4 milliamperes supplied by $I_C$ flows through resistor 16, and, the remaining 2 milliamperes making up $I_B$ flows through element 21. Thus, the 4 milliampere current $I_A$ supplied to point 24 now divides with 2 milliamperes going through element 21 and 2 milliamperes as $I_D$ now flows in the opposite direction to $I_B$ through resistor 22 to ground. Under these conditions, the potential level at point 24 reaches +0.6 volt. In the event that a conventional diode is employed as element 21 when the input level at terminal A is at +0.6 volt, the diode serving as element 21 conducts with a potential drop across it of $V_1$ and 6 milliamperes flows from point 24 to supply $I_B$. When the input level at terminal A shifts to −0.6 volt, element 21 operating in the constant voltage region carries at this time, 2 milliamperes with a constant drop of $V_1$ across it.

Figure 3:
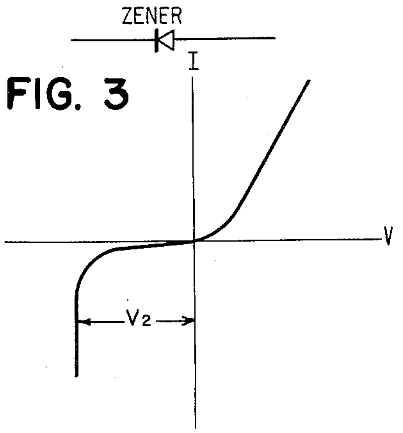
FIG. 3 is the impedance characteristic of a breakdown or Zener type crystal diode.

It will be immediately apparent that while it is possible to design a particular circuit for diodes having different characteristics, in order for the diode shown in FIG. 3 and that of FIG. 2 to be interchangeable in a given circuit, $V_1$ must be equal to the $V_2$ within tolerances compatible with the circuit. For transistor circuitry, the use of this device is very convenient since the forward impedance potential drop of a transistor closely approaches the constant voltage region of a diode. Thus, it may be seen through the use of impedance element 21 and the combination of voltage divider resistors 23 and 22 returned to an appropriate voltage and reference potential, it is possible to provide a voltage translating element on each of outputs 19, 20, 20A and 20B and to establish a potential swing at those points such that it is directly connectable to a subsequent active element, as has just been described in connection with FIG. 1, a potential level swing from −0.6 volt to +0.6 volt at input terminal A is reproduced in an exact inverted replica at point 24 to be applied to the base 3A of transistor 1A.

It will be apparent that the primary important factors in the choosing of an asymmetric impedance for element 21 are that the substantially constant voltage portion of the output characteristic of the impedance be sufficiently well defined for the tolerances of the circuit and that the slope of the constant voltage characteristic be a low impedance as compared with the load. The maximum and minimum current values through the diode may vary over a considerable range and are subject only to the requirement that they not damage the diode and that they intersect the output characteristic in the substantially constant voltage portion.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claim.

What is claimed is:

A voltage level translating device adapted to compensate for the voltage level difference between the output of a first switching circuit and the voltage level input requirement of a second switching circuit comprising an input biasing network including two impedance elements having a point intermediate the impedance elements connected to the input of said second switching circuit for establishing on and off conditions for said second switching circuit, a load resistor in the output of said first switching circuit, an asymmetrically conductive element, having a substantially constant voltage region in its voltage-current characteristic, connected between the load resistor of said first switching circuit and the point intermediate said impedance elements, means for operating said asymmetrically conductive element at different current values in the constant voltage region of its voltage-current characteristic responsive to the voltage level conditions at the output of said first switching circuit, means for varying the current direction through one of said impedance elements responsive to the variation of current through said asymmetrically conductive element including means for providing bi-polar voltage levels at the point intermediate said impedance elements.

References Cited in the file of this patent

UNITED STATES PATENTS

| | | |
|---|---|---|
| 2,182,377 | Guanella | Dec. 5, 1939 |
| 2,655,608 | Valdes | Oct. 13, 1953 |
| 2,655,609 | Shockley | Oct. 13, 1953 |
| 2,714,702 | Shockley | Aug. 2, 1955 |
| 2,790,088 | Shive | Apr. 23, 1957 |
| 2,840,728 | Haugk | June 24, 1958 |

OTHER REFERENCES

Negative Resistance in Germanium Diodes, Radio-Electronics Engineering, April 1953, pages 8–10.

The Bell System Technical Journal, July 1954, pages 833, 834, 840, and 841.